(12) United States Patent
Radic et al.

(10) Patent No.: US 8,735,978 B2
(45) Date of Patent: *May 27, 2014

(54) SEMICONDUCTOR DEVICES HAVING REDUCED GATE-DRAIN CAPACITANCE

(75) Inventors: Ljubo Radic, Chandler, AZ (US); Edouard D. de Frésart, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 448 days.

This patent is subject to a terminal disclaimer.

(21) Appl. No.: 13/034,084

(22) Filed: Feb. 24, 2011

(65) Prior Publication Data

US 2011/0147835 A1 Jun. 23, 2011

Related U.S. Application Data

(60) Division of application No. 12/627,739, filed on Nov. 30, 2009, now Pat. No. 7,919,388, and a continuation-in-part of application No. 12/129,846, filed on May 30, 2008, now Pat. No. 7,838,389.

(51) Int. Cl.
*H01L 29/72* (2006.01)
(52) U.S. Cl.
USPC .................... 257/333; 257/288; 257/E29.262
(58) Field of Classification Search
USPC ................................ 257/288, 333, E29.262
See application file for complete search history.

(56) References Cited

U.S. PATENT DOCUMENTS

| | | | |
|---|---|---|---|
| 4,473,435 A * | 9/1984 | Zafiropoulo et al. | 438/719 |
| 6,013,933 A | 1/2000 | Foerstner et al. | |
| 7,005,371 B2 | 2/2006 | Chinthakindi et al. | |
| 7,023,063 B2 | 4/2006 | Gabric et al. | |
| 7,087,438 B2 | 8/2006 | Kasko et al. | |
| 7,098,476 B2 | 8/2006 | Babich et al. | |
| 7,230,296 B2 | 6/2007 | Gluschenkov et al. | |
| 7,238,568 B2 | 7/2007 | Williams et al. | |
| 7,253,479 B2 | 8/2007 | Sugaya | |
| 7,256,127 B2 | 8/2007 | Gallagher et al. | |
| 7,264,986 B2 | 9/2007 | Gogoi | |
| 7,265,064 B2 | 9/2007 | Morisaki et al. | |
| 7,351,669 B2 | 4/2008 | MacNeil | |
| 7,414,286 B2 | 8/2008 | Hirler et al. | |
| 8,502,287 B2 * | 8/2013 | Radic et al. | 257/288 |

(Continued)

FOREIGN PATENT DOCUMENTS

| | | |
|---|---|---|
| EP | 1742260 A2 | 1/2007 |
| EP | 1744359 A1 | 1/2007 |

OTHER PUBLICATIONS

Follstaedt, D.M., et al., Cavity and Impurity Gettering in He-Implanted Si, Sandia National Laboratories, Feb. 8, 1995.

(Continued)

*Primary Examiner* — Edward Wojciechowicz
(74) *Attorney, Agent, or Firm* — Sherry W. Schumm

(57) ABSTRACT

Embodiments of a semiconductor device include a semiconductor substrate having a first surface and a second surface opposed to the first surface, a trench formed in the semiconductor substrate and extending from the first surface partially through the semiconductor substrate, a gate electrode material deposited in the trench, and a void cavity in the semiconductor substrate between the gate electrode material and the second surface. A portion of the semiconductor substrate is located between the void cavity and the second surface.

18 Claims, 6 Drawing Sheets

(56) References Cited

U.S. PATENT DOCUMENTS

| | | |
|---|---|---|
| 2006/0008991 A1* | 1/2006 | Hijzen et al. ............... 438/259 |
| 2006/0084262 A1 | 4/2006 | Qin |
| 2006/0091453 A1* | 5/2006 | Matsuda et al. ............. 257/330 |
| 2007/0114600 A1 | 5/2007 | Hirler et al. |
| 2007/0197043 A1 | 8/2007 | Van Noort et al. |

OTHER PUBLICATIONS

USPTO "Non-Final Office Action" mailed Nov. 11, 2011; U.S. Appl. No. 12/902,805, filed Oct. 12, 2010.

U.S. Appl. No. 12/902,805, Radic, L., et al., "Semiconductor Devices with Enclosed Void Cavities", filed Oct. 12, 2010; Office Action—Rejection—dated Nov. 9, 2012.

* cited by examiner

FIG. 1 -PRIOR ART-

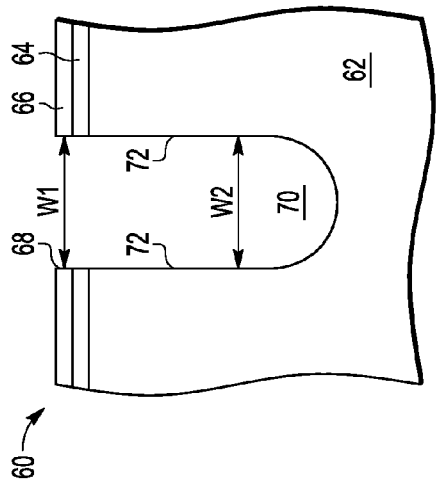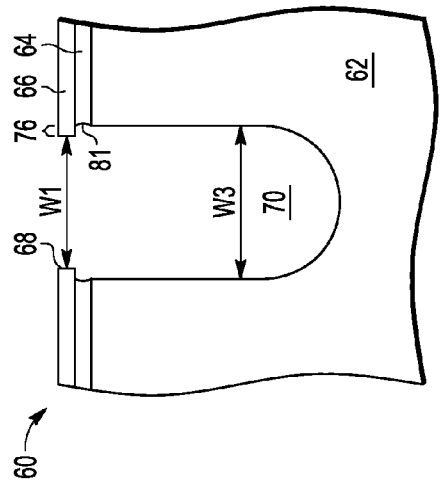
FIG. 4    FIG. 6
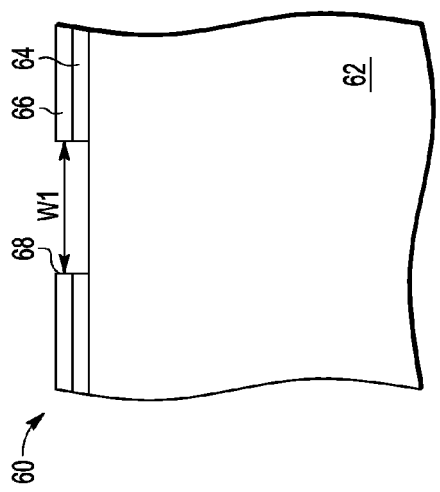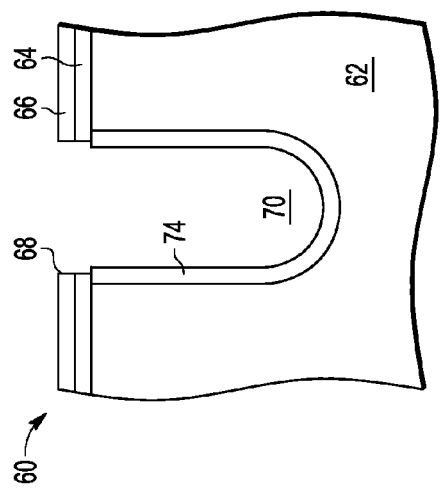
FIG. 3    FIG. 5

US 8,735,978 B2

SEMICONDUCTOR DEVICES HAVING REDUCED GATE-DRAIN CAPACITANCE

CROSS-REFERENCE TO RELATED APPLICATIONS

This application is a divisional of co-pending U.S. application Ser. No. 12/627,739, filed Nov. 30, 2009, which is a continuation-in-part of U.S. application Ser. No. 12/129,846, filed May 30, 2008, the entire contents of which are hereby incorporated by reference.

FIELD OF THE INVENTION

The present invention generally relates to semiconductor devices and, more particularly, to methods for fabricating semiconductor devices, such as vertical metal-oxide-semiconductor field effect transistors, having reduced gate-drain capacitances.

BACKGROUND OF THE INVENTION

Metal-oxide-semiconductor field effect transistors ("MOSFETs") implemented in power integrated circuit platforms are often referred to as "power MOSFETs." As is well-known, the switching speed of a power MOSFET is limited by internal capacitances that occur during on-state operation of the device. One internal capacitance that can significantly affect switching speed is the gate-drain capacitance (commonly abbreviated as "Cgd" and also referred to as the "Miller capacitance"), which arises between the gate formed within the trench of the power MOSFET and the drain region located beneath the gate. To decrease the gate-drain capacitance, power MOSFETS have been introduced wherein a cavity is first formed within the semiconductor substrate between the gate and the drain region of the MOSFET and, specifically, within a doped portion of semiconductor substrate commonly referred to as the "drift space." The cavity is filled with a material having a relatively low dielectric constant (e.g., silicon oxide or silicon nitride) to decrease the permittivity between the drain region and the later-formed gate and thus decrease the gate-drain capacitance of the completed MOSFET.

By implementing a power MOSFET in the above-described manner (i.e., wherein a cavity is formed beneath the device trench and filled with a low dielectric material), the gate-drain capacitance can be decreased and the switching speed of the device can be improved. However, any reductions in gate-drain capacitance are inherently limited by the dielectric constant of the material utilized to fill the cavity, which will necessarily be higher than the dielectric constant of air or partial vacuum. Although additional approaches have been developed to further decrease gate-drain capacitance, such as forming the device trench to have a substantially V-shaped geometry, such approaches also achieve relatively limited reductions in gate-drain capacitance.

BRIEF DESCRIPTION OF THE DRAWINGS

The present invention will hereinafter be described in conjunction with the following drawing figures, wherein like numerals denote like elements, and wherein:

FIG. 1 is a simplified schematic cross-sectional view of vertical power semiconductor device in accordance with the teachings of prior art;

FIGS. 3-15 are simplified schematic cross-sectional views of an exemplary vertical semiconductor device at various stages of manufacture and produced in accordance with the exemplary fabrication method illustrated in FIG. 2.

DETAILED DESCRIPTION

Figure 15:
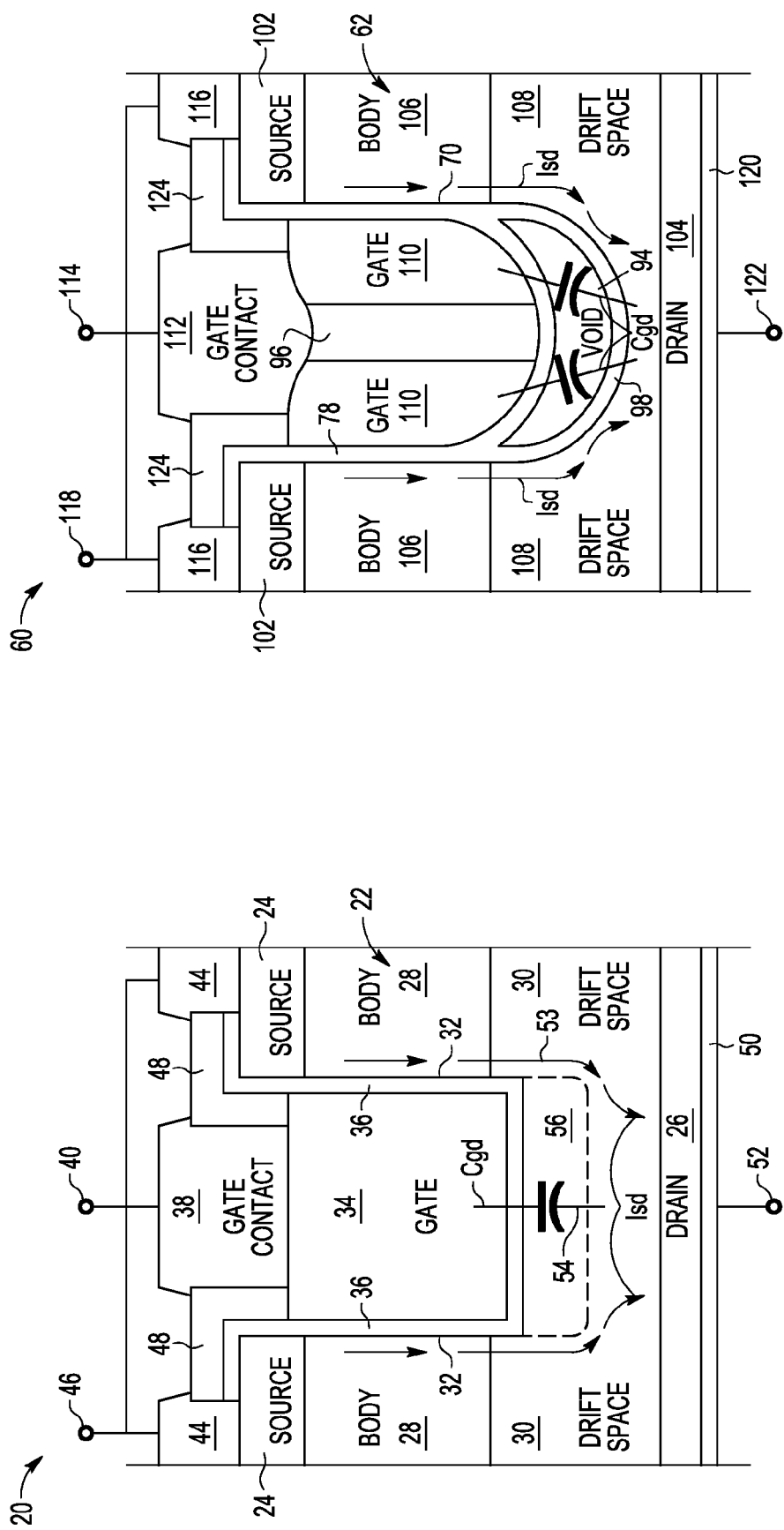

The following Detailed Description is merely exemplary in nature and is not intended to limit the invention or the application and uses of the invention. Furthermore, there is no intention to be bound by any expressed or implied theory presented in the preceding Technical Field, Background, or the following Detailed Description. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator), which is, in turn, disposed over or formed at least partially within a semiconductor substrate. Furthermore, various steps in the manufacture of MOS transistors are well-known and, in the interests of brevity, will only be mentioned briefly herein or will be omitted entirely without providing the well-known process details.

In view of the foregoing section entitled "Background," there exists an ongoing need to provide embodiments of a method for fabricating power MOSFETs, and other semiconductor devices, wherein the gate-drain capacitance of the resulting semiconductor device is significantly reduced as compared to conventional semiconductor devices of the type described above. Ideally, embodiments of such a fabrication method would be relatively inexpensive to perform and highly controllable to ensure optimal process quality, manufacturability, and integrated circuit throughput. It would also be desirable to provide embodiments of a semiconductor device produced utilizing such a method. Other desirable features and characteristics of the present invention will become apparent from the following Detailed Description and the appended Claims, taken in conjunction with the accompanying Drawings and the foregoing Technical Field and Background.

FIG. 1 is a generalized cross-sectional view of a conventional vertical semiconductor device 20 illustrating one manner in which gate-drain capacitance may arise during on-state operation. In this particular example, vertical semiconductor device 20 assumes the form of a N-type power MOSFET formed in a bulk silicon wafer 22; however, it will be understood that vertical semiconductor device 20 can be P-type device and that other semiconductor substrates can be utilized in the production of device 20. As indicated in FIG. 1, a source region 24 and a drain region 26 are formed in opposing portions of wafer 22 (the upper and lower portions of wafer 22 in the illustrated orientation). A body region 28 is formed intermediate source region 24 and drain region 26 and adjacent source region 24, and a drift space 30 is formed intermediate source region 24 and drain region 26. During formation, source region 24, drain region 26, and drift space 30 are implanted with a dopant of a first polarity, while body region 28 is implanted with a dopant of a second, opposing polarity.

For example, in the illustrated exemplary embodiment wherein semiconductor device 20 assumes the form of an N-type device, source region 24, drain region 26, and drift space 30 are implanted with a N-type dopant, and body region 28 is implanted with a P-type dopant.

With continued reference to FIG. 1, a trench 32 is formed in semiconductor wafer 22 and extends from the upper surface of wafer 22 into an upper portion of drift space 30. A conductive gate 34 (e.g., polysilicon) is formed within trench 32. Conductive gate 34 is electrically insulated from body region 28 and drift space 30 by a dielectric layer 36 (e.g., silicon oxide) previously-formed over the inner surfaces of wafer 22 defining trench 32. Contacts are then formed on semiconductor device 20, as needed, to provide electrical contact to the active components of semiconductor device 20. More particularly, a gate contact 38 having a first terminal 40 is formed in ohmic contact with conductive gate 34; a source contact 44 having a second terminal 46 is formed in ohmic contact with source region 24; and a drain contact 50 having a third terminal 52 is formed in ohmic contact with drain region 26. As further indicated in FIG. 1, a dielectric lateral spacer 48 is formed intermediate gate contact 38 and source contact 44 to provide electrical isolation between contacts 38 and 44.

When semiconductor device 20 is switched on, current 53 (identified as "Isd" in FIG. 1) flows from source region 24 to drain region 26. As illustrated in FIG. 1, a gate-drain capacitance 54 (identified as "Cgd" in FIG. 1) develops between conductive gate 34 and drain region 26 through drift space 30. As noted above, gate-drain capacitance 54 negatively impacts the switching speed of semiconductor device 20; that is, an inverse relationship exists between gate-drain capacitance 54 and the switching speed of semiconductor device 20. To decrease gate-drain capacitance 54, semiconductor device 20 may be fabricated to include a cavity 56 (illustrated in phantom in FIG. 1), which is located within drift space 30 between gate 34 and drain region 26 and which is filled with a low dielectric material, such as porous silicon dioxide, which has a dielectric constant less than approximately 2, or carbon-doped silicon dioxide, which has a dielectric constant of approximately 3, to list but two examples. Additionally or alternatively, trench 32 may be formed to have a substantially V-shaped geometry. Such conventional approaches are, however, inherently limited in the extent to which they are able to reduce gate-drain capacitance 54. Therefore, to achieve a more substantial reduction in gate-drain capacitance, the following describes an exemplary embodiment of a method suitable for fabricating a semiconductor device, such as a vertical power MOSFET, including an enclosed void cavity formed between the gate and drain region of the device. Notably, the exemplary method described below enables the enclosed void cavity to be fabricated in a relatively inexpensive and highly controllable manner.

Figure 2:
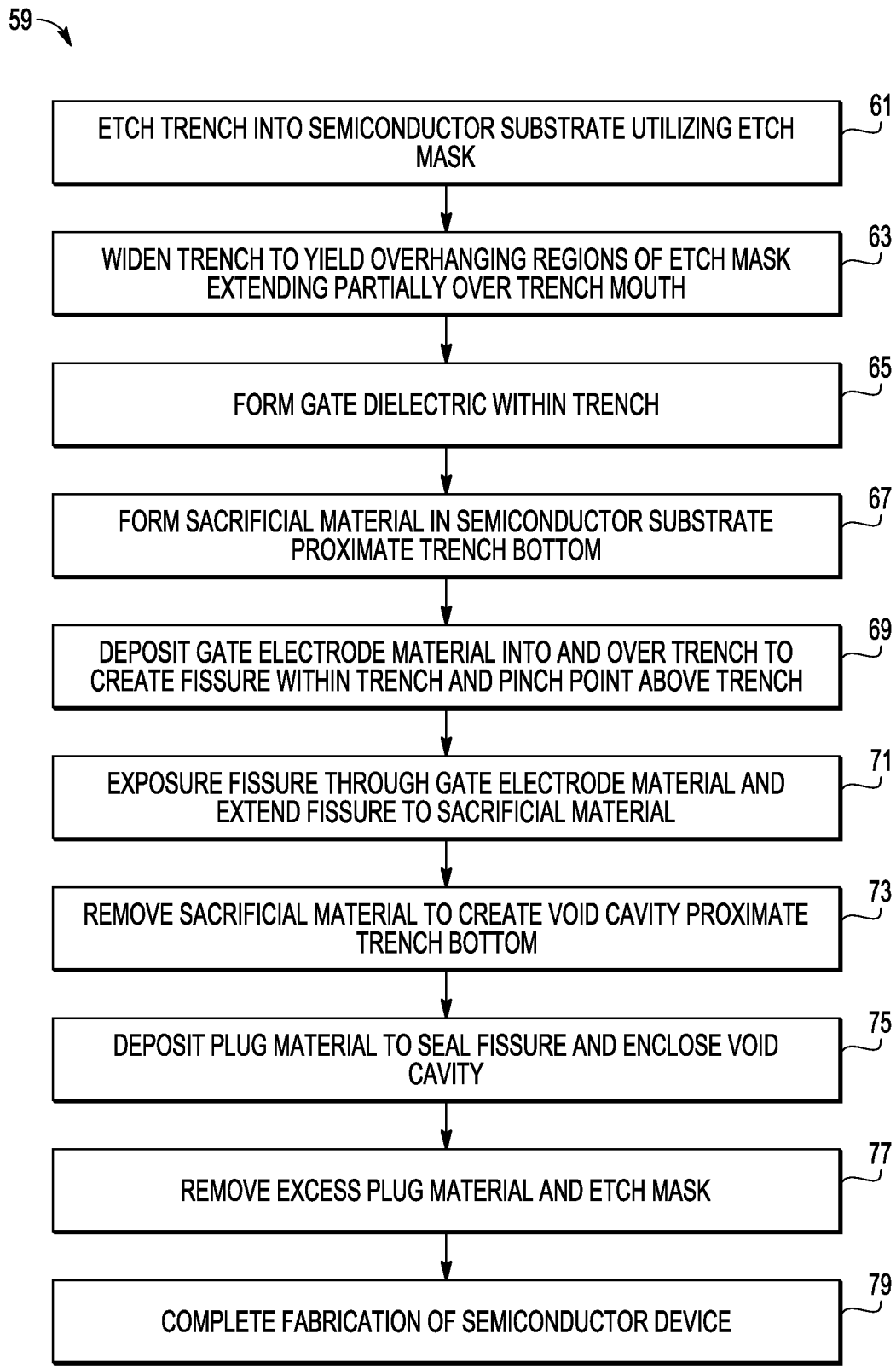
FIG. 2 is a flowchart illustrating an exemplary embodiment of a fabrication method suitable for producing a vertical semiconductor device having a reduced gate-drain capacitance.

FIG. 2 is a flowchart illustrating a method 59 suitable for producing a semiconductor device, such as vertical power MOSFET, having a reduced gate-drain capacitance in accordance with an exemplary embodiment of the present invention. The steps illustrated in FIG. 2 and described below are provided by way of example only; alternative embodiments of fabrication method 59 may include additional steps, omit certain steps, substitute or alter certain steps, or perform certain steps in an order different than that illustrated in FIG. 2. For convenience of explanation, the following will describe method 59 in conjunction with an exemplary semiconductor device, namely, vertical power MOSFET 60 illustrated in FIGS. 3-15 at various stages of manufacture. As is exemplary fabrication method 59, vertical power MOSFET 60 is provided by way of example only; embodiments of method 59 are by no means limited to the fabrication of vertical power MOSFETs and can be utilized to produce any semiconductor device having a trench-type structure wherein a significant decrease in capacitance is sought between the semiconductor substrate and a conductive material within a device trench.

To commence method 59, a trench is etched into a semiconductor substrate utilizing an etch mask (STEP 61, FIG. 2). FIGS. 3 and 4 illustrate one manner in which a trench may be etched into a semiconductor substrate during STEP 61 (FIG. 2). Referring initially to FIG. 3, a semiconductor substrate 62 is first provided. Semiconductor substrate 62 can be a bulk silicon wafer or any other substrate on or in which semiconductor device 60 can be fabricated including, but not limited to, other type IV semiconductor materials, as well as type III-V and II-VI semiconductor materials, organic semiconductors, and combinations thereof, whether in bulk single crystal, polycrystalline form, thin film form, semiconductor-on-insulator form, or combinations thereof. As indicated in FIG. 3, a capping layer 64 is preferably formed over semiconductor substrate 62 to protect and passivate the upper surface of substrate 62. Capping layer 64 may comprise, for example, silicon oxide grown during thermal oxidation or deposited utilizing a conventional deposition technique, such as a chemical vapor deposition (CVD), lower pressure chemical vapor deposition (LPCVD), plasma enhanced chemical vapor deposition (PECVD), or sputtering. Capping layer 64 is conveniently formed to a thickness below 100 micrometers and is preferably formed to a thickness between approximately 0.01 to approximately 1 micrometer. The foregoing notwithstanding, capping layer 64 may be omitted in alternative embodiments.

With continued reference to FIG. 3, an etch mask 66 is formed over capping layer 64 and semiconductor substrate 62. In one embodiment, etch mask 66 comprises silicon nitride deposited over capping layer 64 utilizing a low temperature deposition process, such as PECVD performed utilizing silane ($SiH_4$) and ammonia ($NH_3$) or nitrogen ($N_2$) in the presence of an argon (Ar) plasma. Etch mask 66 is preferably deposited to a thickness of less than 100 micrometers and, more preferably, to a thickness between approximately 0.1 and 0.5 micrometer. An opening 68 is formed through etch mask 66 and through capping layer 64 utilizing, for example, a mask formed utilizing photolithographic processes and subsequent etching. Opening 68 is formed to have a first predetermined width (identified in FIG. 3 as "$W_1$"). As described more fully below, opening 68 enables a trench to be etched into semiconductor substrate 62 that will ultimately contain a substantial portion of vertical semiconductor device 60, when device 60 is completed. Although only a single opening 68 is shown in illustrated portion of etch mask 66, it will be readily appreciated that multiple openings 68 can, and typically will, be formed at various locations across etch mask 66 to enable the simultaneous formation of multiple semiconductor devices on substrate 62.

FIG. 4 illustrates vertical semiconductor device 60 after the formation of a trench 70 within semiconductor substrate 62 (STEP 61, FIG. 2). Trench 70 is formed utilizing one or more anisotropic etching processes, which remove the portion of semiconductor substrate 62 exposed through opening 68 of etch mask 66. In embodiments wherein semiconductor substrate 62 comprises polycrystalline silicon, trench 70 is conveniently formed utilizing a plasma etching process, such as a reactive ion etching process, in conjunction with a chloride (Cl) or bromous acid ($HBr/O_2$) chemistry. It will be noted that, due to the directional nature of the anisotropic etching process, sidewalls 72 of trench 70 are substantially vertical and are closely laterally aligned with the inner edges of etch mask 66 defining opening 68. It will further be noted that trench 70 has an initial width (identified as "$W_2$" in FIG. 4) substantially equivalent to the predetermined width of opening 68 (again, identified as "$W_1$" in FIGS. 3 and 4).

After being etched into semiconductor substrate 62 in the above-described manner (STEP 61, FIG. 2), trench 70 is widened to yield etch mask overhanging regions 76 that extend partially over the mouth of trench 70 (STEP 63, FIG. 2). In a preferred group of embodiments, trench 70 is widened by first growing a sacrificial material, such as a sacrificial oxide, on sidewall 72 of trench 70 (FIG. 4) and subsequently removing the sacrificial material. As will be understood by one of ordinary skill in the art, consumed silicon will represent a substantial portion of final sacrificial material (e.g., oxide) thickness (e.g., in embodiments wherein the sacrificial material comprises silicon oxide, approximately 55% of total oxide thickness will be consumed silicon); thus, although the sacrificial material or oxide is referred to herein as being grown "on" the surfaces of substrate 62 defining trench 70, it will be appreciated that an appreciable portion of the sacrificial material is effectively grown into one or more surfaces of substrate 62 to enable trench 70 to be widened in the manner described below. As a specific example, and with reference to FIG. 5, a first sacrificial oxide 74 (e.g., silicon dioxide) can be thermally grown on the inner surfaces of semiconductor substrate 62 defining trench 70. Sacrificial oxide 74 is conveniently grown on the inner surfaces of semiconductor substrate 62 defining trench 70 by subjecting semiconductor device 60 to elevated temperatures (e.g., in the range of approximately 1000° to approximately 1200° C.elsius) in the presence of an oxidizing ambient for a predetermined time period. Notably, oxide growth processes are well-established in the semiconductor industry and are highly controllable. Thus, during the oxide growth process utilized to widen trench 70, process parameters (e.g., temperature, process duration, and composition of the oxidizing ambient) can be controlled to ensure that sacrificial oxide 74 is reliably and accurately grown to a desired thickness.

Next, as illustrated in FIG. 6, sacrificial oxide 74 is removed to widen trench 70 from its initial width ("$W_2$") to a final predetermined width (identified in FIG. 6 as "$W_3$"). Sacrificial oxide 74 may be removed utilizing an isotropic wet etch, such as a hydrofluoric (HF) acid etch. In embodiments wherein capping layer 64 is present and formed from an oxide, portions of dielectric layer 64 exposed to the etchant are also removed during etching (indicated in FIG. 6 at 81). As a result of this trench widening process, portions 76 of etch mask 66 extend partially over the mouth of newly-widened trench 70. For this reason, portions 76 of etch mask 66 are referred to "overhanging portions 76" herein. As a further result of trench widening, the width of trench 70 ("$W_3$") now exceeds the width of opening 68 ("$W_1$") by approximately twice the thickness of the material removed from the sidewalls of trench 70.

Figure 7:
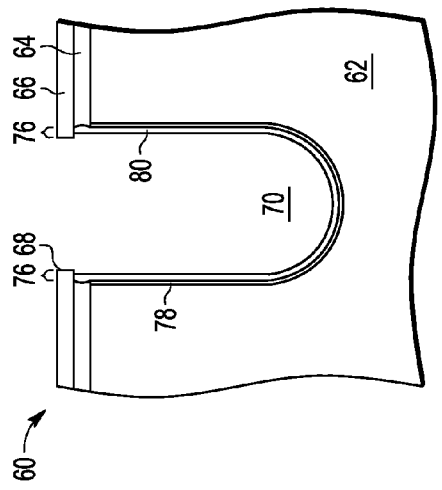

Continuing with exemplary fabrication method 59 (FIG. 2), a gate dielectric is next formed within trench 70 (STEP 65, FIG. 2). With reference to FIG. 7, a dielectric layer 78 may be grown or deposited onto the inner surfaces of semiconductor substrate 62 defining trench 70 during STEP 65 (FIG. 2). For example, in embodiments wherein semiconductor substrate 62 comprises polycrystalline silicon, dielectric layer 78 may comprise a relatively thin layer of silicon oxide grown on the inner surfaces of semiconductor substrate 62 defining trench 70. Dielectric layer 78 is conveniently grow to a thickness of approximately 0.1 to approximately 1000 nanometers and is preferably grown to a thickness of approximately 10 to 50 nanometers.

Figure 8:
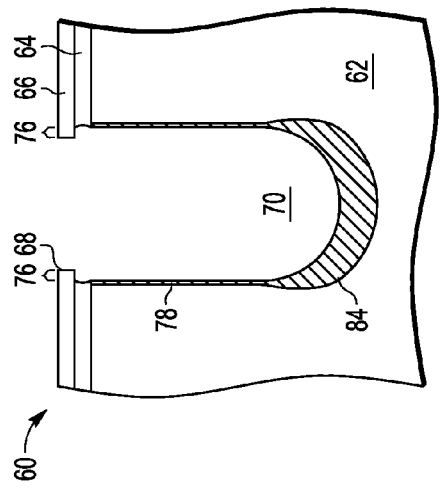
Figure 9:
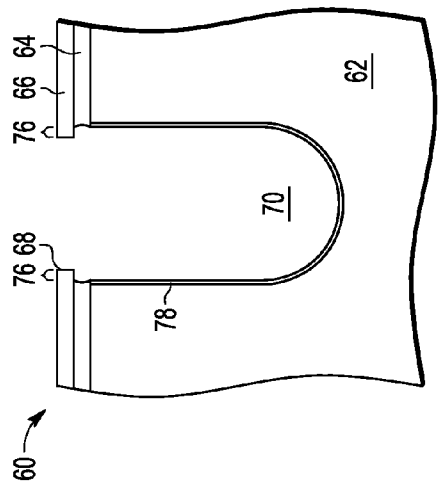
Figure 10:
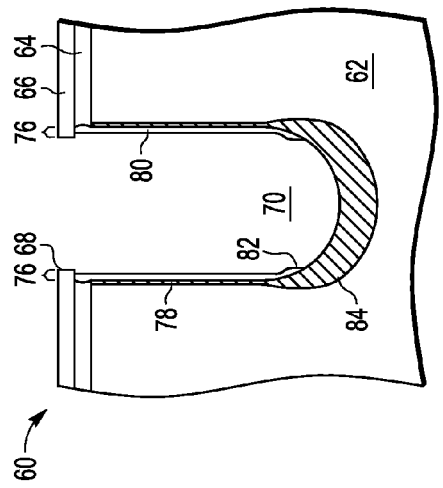

Next, during STEP 67 of exemplary fabrication method 59 (FIG. 2), a sacrificial material is formed in semiconductor substrate 62 proximate a bottom portion of trench 70. FIGS. 8-10 collectively illustrated one manner in which a sacrificial material, in this case a sacrificial oxide, may be formed within semiconductor substrate 62 underlying trench 70. With initial reference to FIG. 8, a liner layer 80 is first deposited over the inner surfaces of semiconductor substrate 62 defining trench 70 and also over the upper surface of etch mask 66 (not shown). Liner layer 80 may comprise, for example, silicon nitride deposited utilizing a chemical vapor deposition technique. Liner layer 80 is conveniently deposited to a thickness of approximately 0.1 nanometer to approximately 100 nanometers. After the deposition of liner layer 80, a bottom portion of liner layer 80 (e.g., the portion of liner layer 80 overlaying the bottom of trench 70) is removed to create a lower opening 82 in layer 80 through which semiconductor substrate 62 is exposed. In embodiments wherein liner layer 80 comprises silicon nitride, the bottom portion of liner layer 80 is conveniently removed utilizing an anisotropic or directional etch, such as a reactive ion etch with a carbon hydrotrifluoride/oxide ($CHF_3/O_2$) or other nitride-selective chemistry.

During anisotropic etching, etch mask 66 shields the outer portions of liner layer 80 overlaying the sidewalls of trench 70 from the etchant. Consequently, the bulk of side portions of liner layer 80 remain intact after etching during STEP 67 (FIG. 2). A second sacrificial oxide 84 (represented by crosshatching in FIG. 9) can thus be selectively grown in the region of semiconductor substrate 62 underlying trench 70 and exposed through opening 82. Second sacrificial oxide 84 is conveniently grown by subjecting semiconductor device 60 to elevated temperatures (e.g., in the range of approximately 1000° to approximately 1200° Celsius) in the presence of an oxidizing atmosphere for a predetermined time period. After the growth second sacrificial oxide 84, the remaining portions of liner layer 80 can be removed to yield the semiconductor structure shown in FIG. 10. In embodiment wherein liner layer 80 comprises nitride, liner layer 80 is conveniently removed utilizing a nitride-selective isotropic etch.

Figure 11:
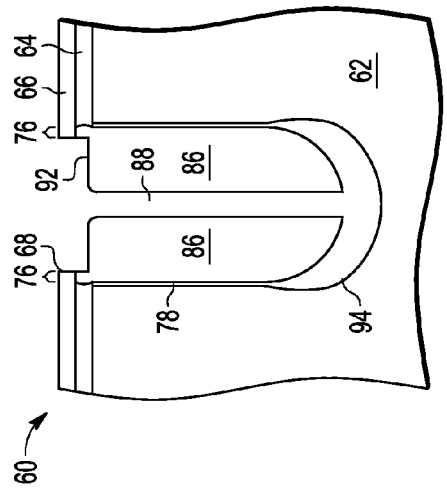

After the formation of a sacrificial material (e.g., sacrificial oxide 84) in semiconductor substrate 62 and underlying trench 70 (STEP 67, FIG. 2), a gate electrode material is deposited into and over trench 70 to create an empty fissure within trench 70 and a pinch point above trench 70 (STEP 69, FIG. 2). By way of example, FIG. 11 illustrates exemplary semiconductor device 60 after a gate electrode material 86 has been conformally blanket deposited over and into trench 70 during STEP 67 (FIG. 2). In one implementation, gate electrode material 86 comprises polycrystalline silicon deposited utilizing a chemical vapor deposition technique, such as LPCVD and a hydrogen-silane reduction. As can be seen in FIG. 11, gate electrode material 86 has accumulated on overhanging region 76 of etch mask 66 and merged or closed off above trench 70 prior to the filling thereof. An elongated void, seam, or empty fissure 88 has consequently been created within partially-filled trench 70, and a pinch point 90 has been created within the upper surface of gate electrode material 86 immediately above empty fissure 88. Notably, the thickness to which gate electrode material 86 is deposited has little to no effect on the width of empty fissure 88; gate electrode material 86 can thus be deposited to a substantially arbitrary thickness during STEP 69 of fabrication method 59. Instead, the width of empty fissure 88 is primarily determined by the width of overhanging regions 76 of etch mask 66. More specifically, conformal deposition of gate electrode material 86 yields an empty fissure 88 having a width substantially equivalent to the cumulative width of overhanging regions 76 or approximately twice the width of each overhanging region 76.

Figure 12:
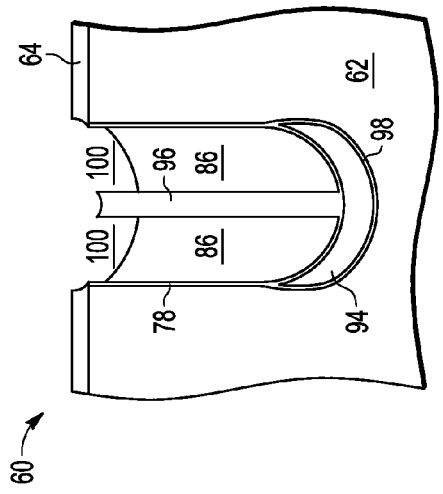
Figure 13:
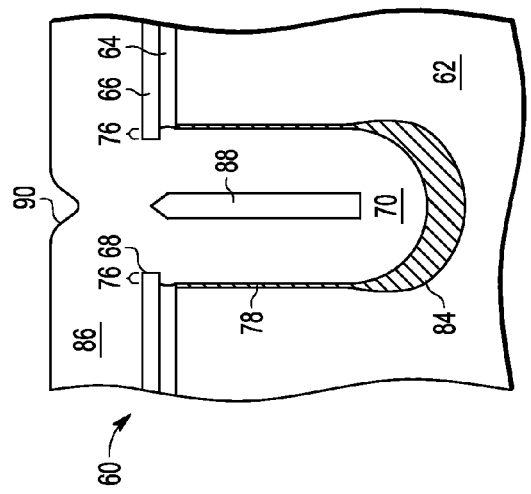

Advancing to STEP 71 of exemplary fabrication method 59 (FIG. 2), one or more etching processes are next performed to expose empty fissure 88 through gate electrode material 86 and to extend fissure 88 to sacrificial oxide 84 (or other sacrificial material) formed in semiconductor substrate 62. FIG. 12 illustrates an exemplary implementation of STEP 71 (FIG. 2) wherein an anisotropic etching process, such as sputtering, is utilized to remove the portion of gate electrode material 86 overlaying etch mask 66 and trench 70. In embodiments wherein gate electrode material 86 comprises polycrystalline silicon, a chloride (Cl) or bromous acid (HBr/$O_2$) chemistry can be employed, as appropriate. After initial exposure of empty fissure 88, the anisotropic etch is continued to extend empty fissure 88 to second sacrificial oxide 84. An equivalent thickness of gate electrode material 86 is also removed proximate opening 68 during etching, as generally indicated in FIG. 12 at 92. After fissure 88 has been extended to sacrificial oxide 84, sacrificial oxide 84 is then removed through empty fissure 88 utilizing, for example, an isotropic etching process having an oxide-selective chemistry. A void cavity 94 is consequently created within semiconductor substrate 62 immediately below trench 70. If desired, additional etches (isotropic and anisotropic) can also be performed to increase cavity dimensions or to modify cavity shape.

Continuing with exemplary fabrication method 59, fissure 88 is next sealed or plugged to enclose void cavity 94 (STEP 75, FIG. 2). Although fissure 88 may be sealed utilizing an oxide growth process, fissure 88 is preferably sealed via the deposition of a plug material. Further emphasizing this point, FIG. 12 illustrates semiconductor device 60 after a plug material 96 has been isotropically deposited over and into empty fissure to seal fissure 88 and enclose cavity 94. Plug material 96 preferably comprises a dielectric material, such as an oxide deposited utilizing a chemical vapor deposition technique. STEP 75 is preferably performed such that void cavity 94, when enclosed, contains a gas (e.g., chlorine) or a gas mixture (e.g., air), which may or may not be under partial vacuum. The dielectric constant of void cavity 94 is thus significantly lower than any solid or liquid material utilized to fill a cavity formed between the gate and the drain region in a conventional power MOSFET device of the type described above in conjunction with FIG. 1. In a preferred embodiment, a thin layer of oxide 98 is grown on the inner surfaces of semiconductor substrate 62 and gate electrode material 86 defining void cavity 94 prior to the deposition of plug material 96 to improve the quality of the cavity-substrate interface.

To maximize the effectiveness of void cavity 94, the quantity of plug material 96 that is deposited into void cavity 94 during STEP 75 of method 59 (FIG. 2) is preferably minimized. In this regard, it is preferred that fissure 88 is formed to be wide enough to facilitate the formation and removal of sacrificial oxide 84, while not being overly wide to allow an undesirable quantity of plug material 96 to excessively fill void cavity 94. It is also desirable for fissure 88 to be relatively narrow to maximize the quantity of gate electrode material 86 within trench 70 and thus minimize gate resistance of semiconductor device 60. Advantageously, embodiments of fabrication method 59 enable fissure 88, and similar fissures formed across semiconductor substrate 62, to be accurately and reliable formed within a relatively narrow deviation of a target width; as will be recalled, a highly-controllable sacrificial material growth process is utilized during STEP 63 (FIG. 2) to widen trench 70 (illustrated in FIGS. 5 and 6) and thus define the widths of overhanging regions 76 of etch mask 66. Furthermore, as explained above in conjunction with STEP 69 (FIG. 2) and FIG. 11, the widths of overhanging regions 76 are determinative of the width of fissure 88. Thus, by utilizing a highly controllable oxide-growth process to widen trench 70, the width of fissure 88 can be determined in a highly reliable and accurate manner, and the effectiveness of void cavity 94 can be maximized.

Figure 14:
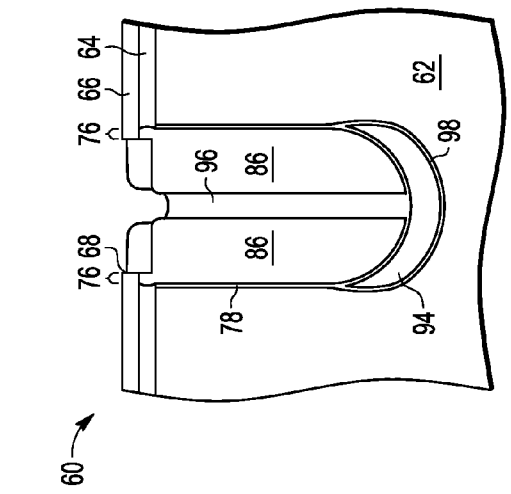

Referring once again to exemplary fabrication method 59 shown in FIG. 2, etch mask 66, an upper portion of gate electrode material 86, and an upper portion of plug material 96 are next removed utilizing a series of etches (STEP 77, FIG. 2). For example, as indicated in FIG. 14, a first isotropic etch can be performed to remove etch mask 66. In embodiments wherein etch mask 66 comprises nitride, a hot phosphoric acid ($H_3PO_4$) wet etch can be performed. As further indicated in FIG. 14 at 100, a second isotropic etch may then be performed to remove an upper portion of gate electrode material 86. In embodiments wherein gate electrode material 86 comprises polycrystalline silicon, a nitric acid ($HNO_3$) and/or hydrofluoric acid (HF) chemistry can be employed. Finally, a third anisotropic etch may also be performed to remove an upper portion of plug material 96. In embodiments, wherein plug material 96 comprises oxide, a hydrofluoric acid (HF) wet acid etch may be utilized.

Finally, at STEP 79 of exemplary fabrication method 59 (FIG. 2), additional fabrication steps are performed to complete semiconductor device 60. FIG. 15 illustrates exemplary semiconductor device 60 in a completed state. As can be seen in FIG. 15, semiconductor device 60 includes a source region 102 and a drain region 104 formed in opposing portions of substrate 62 (upper and lower portions in the illustrated orientation); a body region 106 formed intermediate source region 102 and drain region 104 and adjacent source region 102; and a drift space 108 formed intermediate source region 102 and drain region 104. During formation, source region 102, drain region 104, and drift space 108 are implanted with a dopant of a first polarity, while body region 106 is implanted with a dopant of a second, opposing polarity. For example, if semiconductor device 60 should assume the form of an N-type device, source region 102, drain region 104, and drift space 108 can be implanted with a N-type dopant, and body region 106 with a P-type dopant. Conversely, if semiconductor device 60 should assume the form of a P-type device, source region 102, drain region 104, and drift space 108 can be implanted with a P-type dopant, and body region 106 with a N-type dopant.

A conductive gate 110 (e.g., polysilicon) is formed within trench 70 in the above-described manner; e.g., via the deposition of gate electrode material 86 described above in conjunction with FIGS. 11-14. Conductive gate 110 is generally bisected by plug material 96 and electrically insulated from body region 28 and drift space 30 by dielectric layer 78. As indicated in FIG. 15, contacts have been formed on semiconductor device 60 to provide electrical contact to the active components of device 60. In particular, a gate contact 112 having a first terminal 114 is formed in ohmic contact with conductive gate 110; a source contact 116 having a second terminal 118 is formed in ohmic contact with source region 102; and a drain contact 120 having a terminal 122 is formed in ohmic contact with drain region 104. As further indicated in FIG. 15, a dielectric lateral spacer 124 is formed intermediate gate contact 112 and source contact 120 to provide electrical isolation between contacts 112 and 120.

Figure 16:
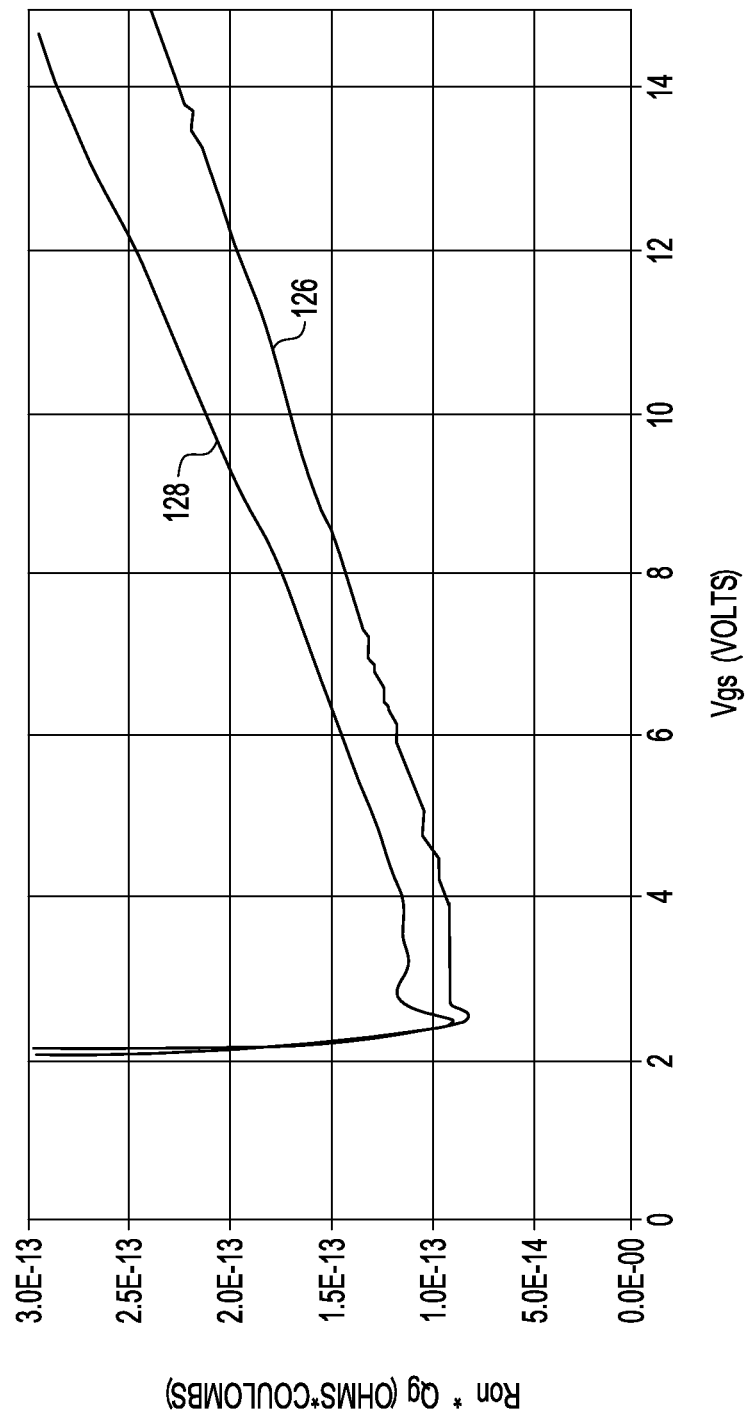
FIG. 16 is a graph illustrating merit series ON-resistance ($R_{ON}$)*gate charge ($Q_G$) versus gate-source voltage ($V_{GS}$) for the exemplary semiconductor device shown in FIGS. 3-15 and for the conventional semiconductor device shown in FIG. 1.

When semiconductor device 60 is switched on, current ("Isd") flows from source region 102 to drain region 104 and a gate-drain capacitance ("Cgd") develops between conductive gate 110 and drain region 104. However, as compared to power MOSFET 20 shown in FIG. 1 and other such conventional semiconductor devices, the permittivity between gate 110 and drain region 104 is significantly reduced by the provision of void cavity 94. The gate-drain capacitance of semiconductor device 60 is thus decreased, and the switching speed of semiconductor device 60 is increased. This may be more fully appreciated by referring to FIG. 16, which is a graph illustrating merit series ON-resistance ($R_{ON}$)*gate charge ($Q_G$) versus gate-source voltage ($V_{GS}$) for semiconductor device 60 shown in FIGS. 2-14 (represented by characteristic 126 in FIG. 16) and for conventional semiconductor device 20 shown in FIG. 1 (represented by characteristic 128 in FIG. 16). As will be understood by one of ordinary skill in the art, the product of series ON-resistance and gate charge ($R_{ON}$*$Q_G$) expresses the resistor-capacitor (RC) time constant of the output stage of a device. Thus, as the $R_{ON}$*$Q_G$ of a given device decreases, the output RC time constant of the device also decreases, and switching speed of the device increases. By comparing characteristic 126 (representative of device 60) to characteristic 128 (representative of device 20), it can be seen that the provision of void cavity 94 underlying gate 110 improves the product of series On-resistance and gate charge ($R_{ON}$*$Q_G$) for all useful gate voltages and, therefore, improves overall device performance. As a further advantage, undesirable drain-gate feedback of device 60 is reduced as a result of this reduction in gate-drain capacitance ($C_{GD}$).

The foregoing has thus provided an exemplary embodiment of a method for fabricating a semiconductor device, such as a power MOSFETs, wherein the gate-drain capacitance of the resulting semiconductor device is significantly reduced as compared to conventional semiconductor devices of the type described above. Notably, embodiments of the above-described fabrication method are relatively inexpensive to perform, while also being highly controllable to ensure optimal process quality, manufacturability, and integrated circuit throughput. While the foregoing describe an exemplary embodiment of a fabrication method in conjunction with a particular type of semiconductor device, it will be appreciated that embodiments of the fabrication method can be utilized to fabricate various other types of semiconductor devices wherein a decrease in gate-drain capacitance is desired or wherein the creation of an enclosed void cavity is desired.

In the foregoing example, void cavity 94 (FIGS. 12-14) was created via the growth and removal of a sacrificial material (e.g., sacrificial oxide 84 shown in FIGS. 9-11) as generally shown and described above in conjunction with FIGS. 7-12 and STEPS 67 and 73 of method 59 (FIG. 2). The foregoing example notwithstanding, it will be appreciated that the void cavity can be created in various other manners. For example, in certain embodiments, void cavity 94 (FIGS. 12-14) may be created utilizing one or more anisotropic and/or isotropic etching processes performed after the formation of seam or fissure 88 (FIG. 12). In such embodiments, a sacrificial material (e.g., sacrificial oxide 84 shown in FIGS. 9-11) need not be grown within semiconductor substrate 62, and STEP 67 of exemplary method 59 (FIG. 2) can be omitted. One or more useful combinations of etching processes suitable for forming a void cavity within a semiconductor substrate are further described in U.S. application Ser. No. 12/129,846, filed May 30, 2008, which has been incorporated herein by reference.

Embodiments of a method for fabricating a semiconductor device having a reduced gate-drain capacitance have thus been provided. In one embodiment, the method includes the steps of etching a trench in a semiconductor substrate utilizing an etch mask, widening the trench to define overhanging regions of the etch mask extending partially over the trench, and depositing a gate electrode material into the trench and onto the overhanging regions. The gate electrode material merges between the overhanging regions prior to the filling of the trench to create an empty fissure within the trench. A portion of the semiconductor substrate is removed through the empty fissure to form a void cavity proximate the trench.

Embodiments of a semiconductor device having a reduced gate-drain capacitance have further been provided. In one embodiment, the semiconductor device includes a semiconductor substrate, a source region formed in a first portion of the semiconductor substrate, and a drain region formed in a second portion of the semiconductor substrate substantially opposite the first portion. A trench is formed in the semiconductor substrate, and a gate is disposed at least partially within the trench. An enclosed void cavity is formed in the semiconductor substrate between the gate and the drain region. The enclosed void cavity decreases the permittivity between the gate and the drain region to reduce the gate-drain capacitance of the semiconductor device.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
   a semiconductor substrate having a source region, a drain region, and a body region intermediate the source region and the drain region;
   a trench formed in the semiconductor substrate;
   a gate disposed at least partially within the trench and including a gate electrode material with an elongated fissure extending entirely through the gate electrode material;
   a dielectric plug material disposed within the elongated fissure; and
   an enclosed void cavity formed in the semiconductor substrate between the gate and the drain region.

2. The semiconductor device of claim 1, wherein the dielectric plug material encloses the enclosed void cavity.

3. The semiconductor device of claim 1, wherein the enclosed void cavity contains a gas.

4. The semiconductor device of claim 3, wherein the enclosed void cavity contains a chlorine gas.

5. The semiconductor device of claim 1, further comprising:
   an oxide layer on inner surfaces of the semiconductor substrate that define the enclosed void cavity.

6. The semiconductor device of claim 1, further comprising:
   a dielectric layer that electrically insulates the gate from the semiconductor substrate.

7. The semiconductor device of claim 1, wherein:
the source region is located at an upper surface of the semiconductor substrate;
the trench extends into the semiconductor substrate from the upper surface; and
the drain region is located at a lower surface of the semiconductor substrate.

8. The semiconductor device of claim 7, further comprising:
a body region of a first polarity underlying the source region; and
a drift space of a second, opposing polarity underlying the body region and overlying the drain region.

9. The semiconductor device of claim 8, wherein the enclosed void cavity extends into the drift space.

10. A semiconductor device comprising:
a semiconductor substrate having a first surface and a second surface opposed to the first surface;
a trench formed in the semiconductor substrate and extending from the first surface partially through the semiconductor substrate;
a gate electrode material deposited in the trench, wherein the gate electrode material includes an elongated fissure that extends entirely through the gate electrode material;
a dielectric plug material disposed within the elongated fissure; and
a void cavity in the semiconductor substrate between the gate electrode material and the second surface, wherein a portion of the semiconductor substrate is located between the void cavity and the second surface.

11. The semiconductor device of claim 10, wherein the plug material and the gate electrode material seal the void cavity.

12. The semiconductor device of claim 10, further comprising:
a source region proximate the first surface of the semiconductor substrate; and
a drain region proximate the second surface of the semiconductor substrate.

13. The semiconductor device of claim 12, further comprising:
a body region of the semiconductor substrate, the body region having a first polarity and positioned below the source region and adjacent the gate electrode material; and
a drift space of a second, opposing polarity positioned between the body region and the drain region, wherein the portion of the semiconductor substrate located between the void cavity and the second surface forms a portion of the drift space.

14. A semiconductor device comprising:
a semiconductor substrate;
a trench extending partially through the semiconductor substrate, the trench having sidewalls perpendicular with a first surface of the semiconductor substrate;
a gate electrode material deposited in the trench and including an elongated fissure that extends entirely through the gate electrode material;
a plug material disposed within the elongated fissure; and
a void cavity underlying the gate electrode material, wherein the plug material and the gate electrode material seal the void cavity.

15. The semiconductor device of claim 14, wherein the semiconductor substrate comprises a source region, a drain region, a body region intermediate the source region and the drain region, and a drift space intermediate the body region and the drain region.

16. The semiconductor device of claim 15, wherein the gate electrode material is adjacent the body region and the void cavity is adjacent the drift space.

17. The semiconductor device of claim 14, further comprising:
a dielectric layer on the sidewalls of the trench between the gate electrode material and the semiconductor substrate.

18. The semiconductor device of claim 14, further comprising:
an oxide layer on surfaces of the semiconductor substrate, the gate electrode material, and the plug material that define the void cavity.

* * * * *